United States Patent
Sasho et al.

(10) Patent No.: US 6,900,693 B2
(45) Date of Patent: May 31, 2005

(54) POWER AMPLIFYING APPARATUS AND RADIO COMMUNICATIONS APPARATUS USING SAME

(75) Inventors: Noboru Sasho, Kanagawa (JP); Masayoshi Abe, Tokyo (JP)

(73) Assignee: Sony Corporation (JP)

( * ) Notice: Subject to any disclaimer, the term of this patent is extended or adjusted under 35 U.S.C. 154(b) by 70 days.

(21) Appl. No.: 10/429,714

(22) Filed: May 6, 2003

(65) Prior Publication Data

US 2003/0214359 A1 Nov. 20, 2003

(30) Foreign Application Priority Data

May 20, 2002 (JP) .................................... P2002-144224

(51) Int. Cl.[7] .............................................. H03G 3/30
(52) U.S. Cl. ...................................... 330/133; 330/136
(58) Field of Search ................................ 330/132, 133, 330/136, 140, 285; 348/678, 707

(56) References Cited

U.S. PATENT DOCUMENTS 6,650,181 B2 * 11/2003 Shinjo et al. ............... 330/136
6,714,071 B1 * 3/2004 Page ........................... 330/136

FOREIGN PATENT DOCUMENTS

JP             WO0203545       *  1/2002

* cited by examiner

Primary Examiner—Steven J. Mottola
(74) Attorney, Agent, or Firm—Ronald P. Kananen; Rader, Fishman & Grauer PLLC

(57) ABSTRACT

By extracting a portion of RF signals from an input side of a multistage RF amplifier with a detector, and converting extracted signals into envelope signals, low-frequency second-harmonic distortion components are efficiently extracted. Then, the extracted low-frequency second-harmonic distortion components are amplified with a low-frequency amplifier, and phase adjusted with a phase shifter, after which they are injected into a gate or base bias of the final stage of the multistage RF amplifier. As a result, the low-frequency second-harmonic distortion components are converted into third-harmonic distortion due to the non-linearity of transistors, and the third-harmonic distortion thus obtained cancels out the third-harmonic distortion originally present in the multistage RF amplifier.

5 Claims, 10 Drawing Sheets

POWER AMPLIFYING APPARATUS AND RADIO COMMUNICATIONS APPARATUS USING SAME

CROSS REFERENCE TO RELATED APPLICATIONS

The present document claims priority to Japanese Priority Document JP 2002-144224, filed in the Japanese Patent Office on May 20, 2002, the entire contents of which are incorporated herein by reference to the extent permitted by law.

BACKGROUND OF THE INVENTION

1. Field of the Invention

The present invention relates to a power amplifying apparatus and a radio communications apparatus using this power amplifying apparatus. More particularly, the present invention relates to a power amplifying apparatus having a distortion compensation function and a radio communications apparatus using such a power amplifying apparatus.

2. Description of the Related Art

In radio communications apparatuses such as cellular phones which adopt linear modulation systems including CDMA (Code Division Multiple Access) and the like, power amplifying apparatuses with low distortion and high efficiency are required. As a power amplifying apparatus of such sort, a power amplifying apparatus having a distortion compensation function is known. An example of the configuration thereof is shown in FIG. 13. This conventional power amplifying apparatus shown in FIG. 13 includes an amplification FET 101, an input matching circuit 102, a feedforward path 103, a low-frequency choke inductor 104 and an output matching circuit 105, and suppresses third-harmonic distortion by means of linearization using feedforwarding.

The operation principles for the power amplifying apparatus having the configuration described above are described below. First, by having two sine wave signals or modulated signals inputted via the input matching circuit 102, the amplification FET101 handles large signals. In other words, it is in a state where it is generating high-order harmonics besides a basic wave. Of the second-harmonic distortion waves generated by the amplification FET 101, the low-frequency components are converted into voltage signals by a load resistor 113 after passing through an RF choke inductor 111 and a capacitor 112 of the feedforward path 103. The low-frequency components are amplified by an AF amplifier 114.

The low-frequency components amplified by the AF amplifier 114 are reinjected into a drain of the amplification FET 101 after passing through a capacitor 116 and a choke inductor 117. A portion of the reinjected low-frequency components is converted into third-harmonic distortion due to the non-linearity of the amplification FET 101. Then, at the drain of the amplification FET 101, the third-harmonic distortion that originally existed is cancelled by the newly generated third-harmonic distortion, and third-harmonic distortion components are attenuated as a result.

The principles of the distortion reduction in the feedforward system may be explained analytically with equations as follows.

Input/output characteristics of a power amplifier are shown with a polynomial expression below.

$$Vo(t) = G1 \cdot Vi(t) + G2 \cdot Vi^2(t) + G3 \cdot Vi^3(t) + \Lambda \quad (1)$$

If the angular frequencies of the two sine wave signals to be inputted to the power amplifier are taken to be $\omega1$ and $\omega2$, the angular frequency of a second-harmonic distortion component in the power amplifier output is $\omega2 \cdot \omega1$. This component is reinjected into the power amplifier by any suitable method. In the conventional example above, it is reinjected from the drain side of the amplification FET 101.

$$Vi(t) = A\cos\omega1t + B\cos\omega2t + H\cos\{(\omega2-\omega1)t+\phi\} \quad (2)$$

In equation (2), the second term represents low-frequency second-harmonic distortion components. However, H is a coefficient of the amplitude, and $\phi$ is the phase shift amount.

Next, equation (2) is substituted into equation (1). In so doing, instead of listing every term, which makes the equation complicated, only the second-order coefficient terms are listed, the outcome of which is as follows.

$$G_2 \cdot Vi^2(t) = G_2 \frac{A^2 + B^2 + H^2}{2} + G_2 BH\cos(\omega1t - \phi) + \quad (3)$$

$$G_2 AH\cos(\omega2 + \phi) + G_2 \left\{\frac{A^2}{2}\cos(2\omega1t) + \frac{B^2}{2}\cos(2\omega2t)\right\} +$$

$$G_2 AB\{\cos(\omega1 + \omega2)t + \cos(\omega2 - \omega1)\} +$$

$$G_2 AH\cos\{(2\omega_1 - \omega_2)t - \phi\} + G_2 BH\{(2\omega_2 - \omega_1)t + \phi\}$$

Since the last two terms in equation (3) have angular frequency components $2\omega_1 \cdot \omega_2$ and $2\omega_2 \cdot \omega_1$, they are third-harmonic distortion components (IM3). If these terms can cancel the third-harmonic distortion components generated in the power amplifier, it would be possible to attenuate third-harmonic distortion components.

SUMMARY OF THE INVENTION

The conventional power amplifying apparatus mentioned above includes a single stage transistor. However, power amplifiers used in ordinary cellular phones often employ two-stage or three-stage transistors in order to obtain sufficient power gain. In addition, the most significant problem with the conventional power amplifier mentioned above is that because it has such a configuration that the low-frequency signal is reinjected into the drain of the amplification FET 101, a coil with an extremely large inductance needs to be provided as the low-frequency choke inductor 104. This low-frequency choke inductor 104 is necessary in order to separate the reinjected low-frequency component and a DC power supply. In other words, it is necessary in order to prevent the low-frequency component from passing through to the side of the power supply. As the low-frequency choke inductor 104, an inductance value of several $\mu$H is sometimes required. This runs counter to the idea of down-sizing and cost reduction.

As an example of another conventional amplifier, there is described a linear amplifier in Japanese Application Publication No. H7-22849. In this linear amplifier, the same basic idea is at work in that attenuation of third-harmonic distortion is achieved by extracting low-frequency second-harmonic distortion components and reinjecting them. However, unlike the conventional amplifier mentioned above, this linear amplifier adopts a configuration in which low-frequency second-harmonic distortion components are extracted from the output section and are fed back to the input section.

In this linear amplifier, some results may be achieved with wave patterns in which, for example, two sine waves are repeated. However, when random signals such as digital modulated waves are inputted, the desired results with respect to third harmonic distortion attenuation cannot be achieved due to propagation time delay in the feedback path. Particularly with respect to signals with a high chip rate such as W-CDMA (Wide-band CDMA) modulated signals, in other words signals with rapid envelope variations, distortion cancellation using a feedback system is too slow and is thought to be difficult.

The present invention is devised in view of the problems described above, and it provides a low-distortion, high efficiency, down-sized and low-cost power amplifying apparatus which can be realized while retaining the benefits of a feedforward system, as well as a radio communications apparatus using such a power amplifying apparatus.

A power amplifying apparatus according to the present invention includes a multistage RF amplifier including a plurality of stages of transistors, a detector for extracting a portion of RF signals from the input side of the multistage RF amplifier and converting the extracted signals into envelope signals, and feedforward means for injecting low-frequency signals outputted from the detector into a gate or base bias circuit of the final stage of the multistage RF amplifier.

In this power amplifying apparatus, the detector extracts low-frequency second-harmonic distortion components efficiently by extracting a portion of the RF signals and converting the extracted RF signals into envelope signals. The extracted low-frequency second-harmonic distortion components are injected into the gate/base bias of the final-stage transistor in the multistage RF amplifier by the feedforward means. By this injection of the second-harmonic distortion components into the gate/base bias of the final-stage transistor, the second-harmonic distortion components are converted into third-harmonic distortion due to the non-linearity of the transistor, and the third-harmonic distortion originally present in the multistage RF amplifier is cancelled therewith. In addition, in the bias circuit, since the low-frequency second-harmonic distortion components are prevented from passing through to the power supply side by a bias resistor, it becomes unnecessary to use a device with a large inductance.

As discussed above, according to the present invention, in a power amplifying apparatus having a distortion compensation function, by adopting a configuration in which low-frequency second-harmonic components are efficiently extracted by a detector and reinjected into a gate/base bias circuit of a transistor of the final stage of multistage RF amplifier, adjacent channel leakage power can be reduced since the injected second-harmonic distortion components are converted into third-harmonic distortion due to the non-linearity of the transistor, and since the third-harmonic distortion thus obtained cancels out third-harmonic distortion that is originally present in the multistage RF amplifier.

In particular, by reinjecting the low-frequency second-harmonic distortion components into the gate/base bias circuit of the final stage of the multistage RF amplifier, the low-frequency second-harmonic distortion components are prevented from passing through to the side of the power supply by a bias resistor, and down-sizing of the power amplifying apparatus as well as a reduction in cost can be achieved since an inductance element need not be used. In addition, because a feedforward configuration, instead of a feedback configuration, is adopted, a reduction in third-harmonic distortion can be achieved even when amplifying modulated waves having fast envelope variation, such as W-CDMA modulated waves and the like.

BRIEF DESCRIPTION OF THE DRAWINGS

The invention disclosed herein will become better understood as a detailed description is made of the preferred embodiments with reference to the appended drawings in which.

DESCRIPTION OF THE PREFERRED EMBODIMENTS

Hereinafter, preferred embodiments of the present invention are described in detail with reference to the drawings.

<First Embodiment>

Figure 1:
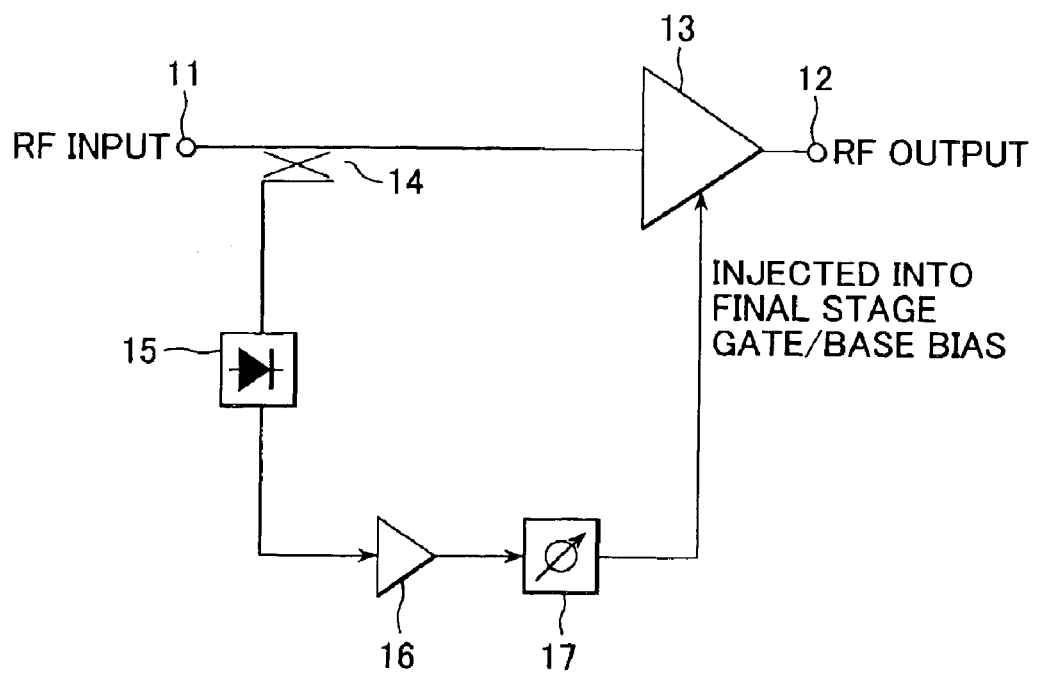
FIG. 1 is a block diagram which shows an example of a configuration of a power amplifying apparatus according to the first embodiment of the present invention.

FIG. 1 is a block diagram showing an example of the configuration of a power amplifying apparatus according to the first embodiment of the present invention. Between an input terminal 11 and an output terminal 12 in FIG. 1, there is connected a multistage RF amplifier 13, which includes amplification transistors connected in multiple stages. To the input terminal of the multistage RF amplifier 13 are connected a detector 15, a low-frequency amplifier 16 and a phase shifter 17 in this order and in cascade via an RF coupler 14. However, the low-frequency amplifier 16 and the phase shifter 17 are not essential elements, and it is thus also possible to provide either one of the two, as deemed appropriate, instead of both. An output signal of the phase shifter 17 is injected into a bias circuit of a gate (or a base) of a final stage transistor of the multistage RF amplifier 13. A feedforward means is thus formed.

The circuit operation of the power amplifying apparatus according to the first embodiment with the configuration explained above is described below.

RF modulated signals such as N-CDMA (Narrow-band CDMA) or W-CDMA are inputted from the input terminal 11. Although details will be omitted for purposes of brevity, in linear modulated signals, such as CDMA, the envelope level varies because, unlike constant envelope modulated signals, such as GMSK (Gaussian(-filtered) Minimum Shift Keying), information is also carried in the amplitude direction.

A large portion of the inputted RF modulated signals is directly inputted to the multistage RF amplifier 13. In addition, a portion of the RF modulated signals is extracted by the RF coupler 14 and is inputted to the detector 15. The signals inputted to the detector 15 are converted into envelope signals of a modulated wave with a device that utilizes its non-linearity, such as diodes. Although twice as much harmonic waves or more as modulated waves are generated within the detector 15, by virtue of the low-pass characteristics of an output section of the detector 15, only low-frequency signals around the DC frequency are outputted. These low-frequency signals are equivalent to, of the second-harmonic distortion components, signals that approximate DC signals.

The low-frequency signals (low-frequency harmonic-harmonic distortion signals) are inputted to the low-frequency amplifier 16, and are outputted after receiving appropriate voltage amplification. The output signals from the low-frequency amplifier 16 are then inputted to the phase shifter 17, and are injected into a gate bias circuit of the final stage of the multistage RF amplifier 13 after undergoing a predetermined phase adjustment in the phase shifter 17. In the description above, it is assumed that the low-frequency amplifier 16 is FET based. However, if the low-frequency amplifier 16 is bipolar transistor based, the output signals from the phase shifter 17 are injected into a base bias circuit of the final stage of the multistage RF amplifier 13.

Compared to a case where the output signals from the phase shifter 17 are injected from the drain/collector bias circuit, when the output signals are injected from a gate/base bias, not as large a current flows through the bias circuit, and thus, a resistor can be inserted in series. The gate/base potential varies as the low-frequency signals take the resistance thereof to be a load. When injecting the output signals from the phase shifter 17 by way of the drain/collector bias circuit, a resistor cannot be inserted since it results in a large power loss. Therefore, an inductor with a large inductance value is necessary as a load for the low-frequency signals.

The transistor of the final stage ordinarily operates in a largely non-linear state in order to operate efficiently. The low-frequency signals inputted to the final stage gate/base bias circuit are thus converted to third-harmonic distortion due to the non-linearity of the transistor in accordance with the logic of equation 3 mentioned above. Then, the third-harmonic distortion obtained above cancels out the third-harmonic distortion originally present in the multistage RF amplifier 13, thereby attenuating the third-harmonic distortion components in the output.

As an index that determines the distortive characteristics of a power amplifier, there is the adjacent channel leakage power ratio (ACPR). The central distortive element that determines the ACPR characteristics is third-harmonic distortion components. Therefore, if third-harmonic distortion can be reduced, the ACPR can also be reduced. Thus, since the power amplifier can be used in a more largely non-linear state, higher efficiency for the power amplifier can be achieved.

EXAMPLE OF THE FIRST EMBODIMENT

Figure 2:
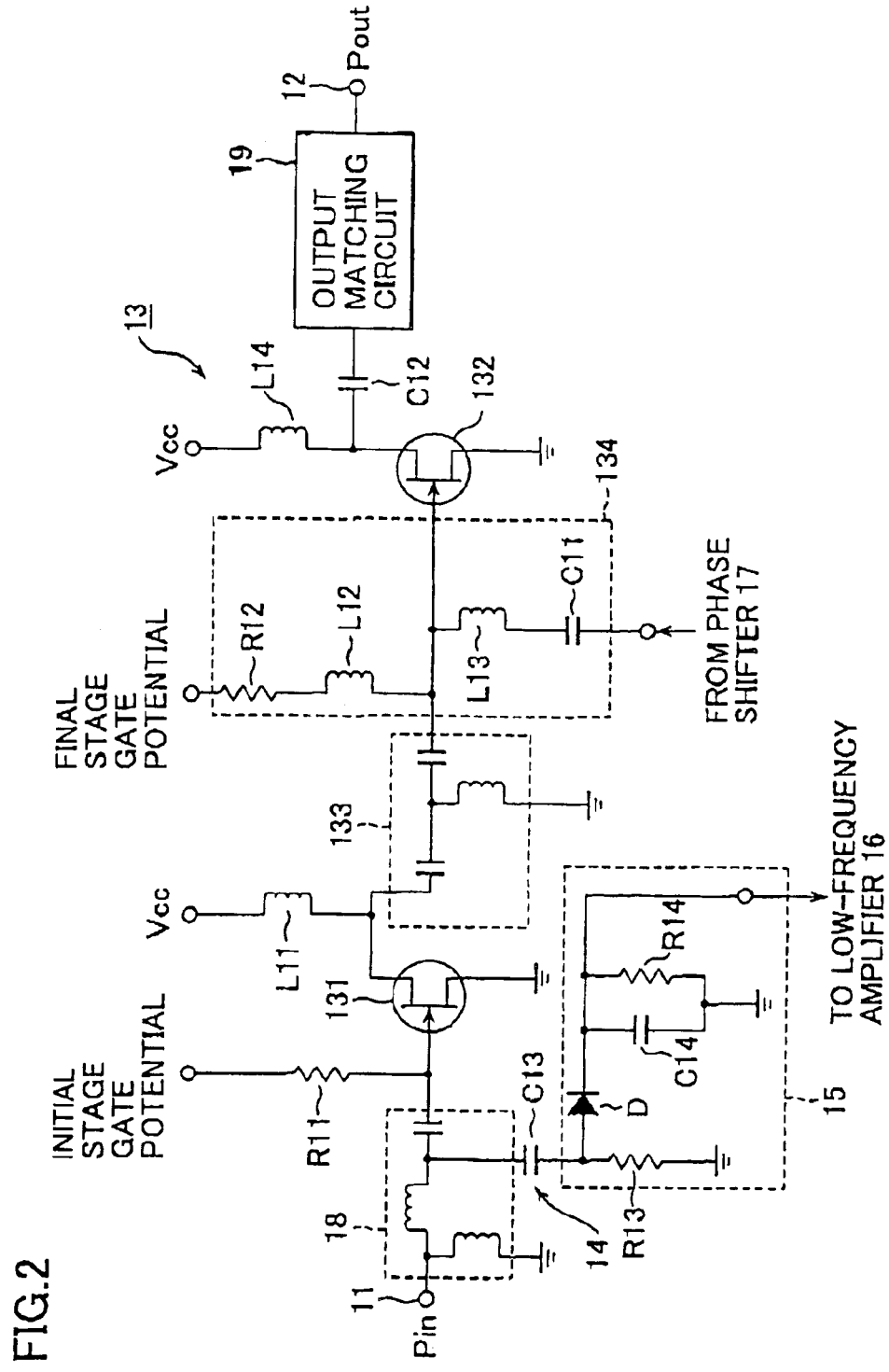
FIG. 2 is a circuit diagram which shows a specific example of a power amplifying apparatus according to a modified example of the first embodiment.

FIG. 2 is a circuit diagram showing an example of a power amplifying apparatus according to a modification of the first embodiment, and the same reference numerals as those in FIG. 1 are used for equivalent or like parts.

In FIG. 2, the low-frequency amplifier 16 and the phase shifter 17 shown in FIG. 1 are omitted. In addition, an input matching circuit 18 is connected between the input terminal 11 and the multistage RF amplifier 13 and an output matching circuit 19 is connected between the multistage RF amplifier 13 and the output terminal 12.

In the present example, the multistage RF amplifier 13 is shown to have a two-stage configuration, and FETs are used as transistors for the multistage RF amplifier 13. In other words, the multistage RF amplifier 13 has an initial-stage FET 131 and a final-stage FET 132. The drain of the initial stage FET 131 and the gate of the final stage FET 132 are connected via an inter-stage matching circuit 133. The gate of the initial stage FET 131 is connected to an initial stage gate potential via resistance R11. The drain of the initial stage FET 131 is connected to a power supply Vcc via an RF choke inductor L11.

A gate bias circuit 134 of the final stage FET 132 includes a bias resistance R12 and an RF choke inductor L12 serially-connected between a final stage gate potential and the gate of the final stage FET 132, as well as an RF choke inductor L13 and a DC cut capacitor C11 serially-connected between the gate of the final stage FET 132 and an output terminal of the phase shifter 17 (see FIG. 1). The drain of the final stage FET 132 is connected to the power supply Vcc via a choke inductor L14, and is connected to the output terminal 12 via a capacitor C12 and the output matching circuit 19.

In this gate bias circuit 134, the RF choke inductor L12 prevents RF signals from passing through to the power supply side, while allowing low-frequency signals and DC signals to pass through to the power supply side. In addition, the DC cut capacitor C11 allows the low-frequency signals supplied from the phase shifter 17 through to the side of the final stage FET 132, while preventing DC signals from passing through. A relatively large value (up to several $\mu$F) is needed for the capacitance of the DC cut capacitor C11, however, obtaining small and low-cost devices should prove easy given the recent advances in such devices.

Figure 13:
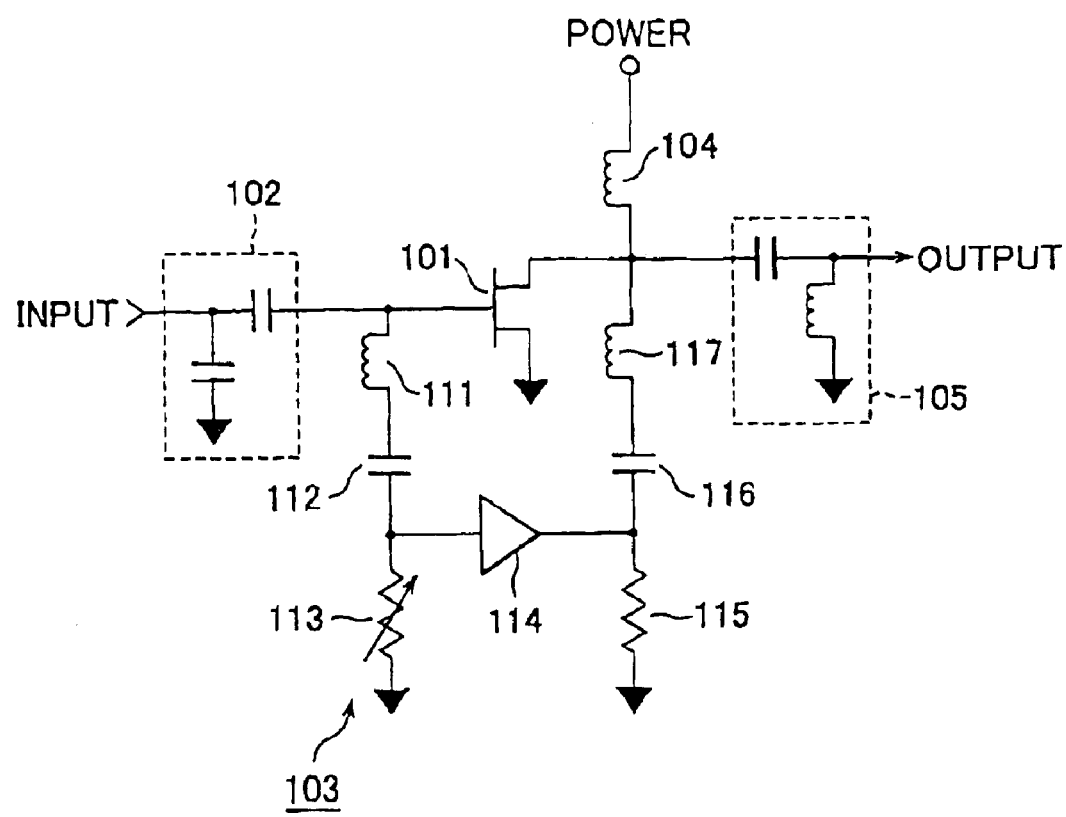
FIG. 13 is a circuit diagram which shows a conventional example of a power amplifying apparatus having a distortion compensation function.

However, as was explained as part of the related art, when a choke inductor with a large inductance (for example, of several $\mu$H to 10 $\mu$H) is used as a choke inductor for preventing low-frequency second-harmonic distortion signals from passing through to the power supply side (as in the low-frequency choke inductor 104 in FIG. 13), this no longer is the case, and the result is a larger power amplifying apparatus, and increased costs. As opposed thereto, since in the power amplifying apparatus according to the present example, the choke inductor L14 need only have an inductance of roughly several nH to 10 nH, it contributes greatly to down-sizing and reducing costs.

A capacitor C13 is used as the RF coupler 14. A diode is used as a non-linear element in the detector 15. An FET or a bipolar transistor may also be used in place of the diode as the non-linear element, and similar effects may still be achieved. The anode of a diode D is connected to the output terminal of the input matching circuit 18 via the RF coupling capacitor C13. A resistor R13 is connected between the anode of the diode D and ground. A capacitor C14 and a resistor R14 are connected in parallel between the cathode of the diode D and ground.

Thus, in the power amplifying apparatus having a distortion compensating function described above, by employing a configuration in which low-frequency second-harmonic distortion components are extracted efficiently by the detector 15 and are reinjected into the gate/base bias circuit of the final gate transistor in the multistage RF amplifier 13, the multistage RF amplifier 13 is linearized, in other words, the injected second-harmonic distortion components are converted into third-harmonic distortion due to the non-linearity of the transistors. Since the third-harmonic distortion obtained in this manner cancels out the third-harmonic distortion that was originally present in the multistage RF amplifier 13, adjacent channel leakage power can be reduced.

In particular, the following effects can be achieved by injecting the low-frequency second-harmonic distortion components between the stages in the multistage RF amplifier 13, or, more specifically, into the gate/base bias circuit of the final stage. The gate circuit of an FET is extremely high in impedance as compared to the drain, and is ordinarily given a gate potential via a bias resistor R12 as is apparent from the example in FIG. 2. Thus, since the low-frequency second-harmonic distortion components are prevented from passing through to the power supply side by the bias resistor R12, a large inductance element described in relation with the related art is no longer necessary, and, as a result, miniaturization of the power amplifying apparatus as well as a reduction in cost can be achieved.

In addition, because a feedforward configuration, rather than a feedback configuration, is adopted, even in cases where, for example, modulated waves, in which the envelope curve rapidly varies as in W-CDMA modulated waves, are amplified, third-harmonic distortion can be attenuated. This shows that W-CDMA and next-generation high-speed modulation systems can be accommodated. Furthermore, additional elements and components that need to be added to linearize the conventional power amplifying apparatus are the detector 15, the low-frequency amplifier 16 and the phase shifter 17 and the like, all of which can be reduced in size through IC technology. Therefore, the configuration of the power amplifying apparatus according to the present embodiment is suitable for modularization, and through modularization, an all-in-one linear power amplifying apparatus can be realized.

In addition, in the example of FIG. 2, the multistage RF amplifier 13 is shown, as an example, with a two-stage configuration, however, even if the multistage RF amplifier 13 is configured with three or more stages, similar effects can still be achieved by reinjecting low-frequency second-harmonic distortion components between the stages thereof. Since the transistor of the final stage operates in a non-linear manner in order to increase the power conversion efficiency, and distortion is generated therefrom, by supplying low-frequency second-harmonic distortion components into the gate/base bias circuit of the transistor of the final stage, distortion compensation effects can be further enhanced.

Figure 3:
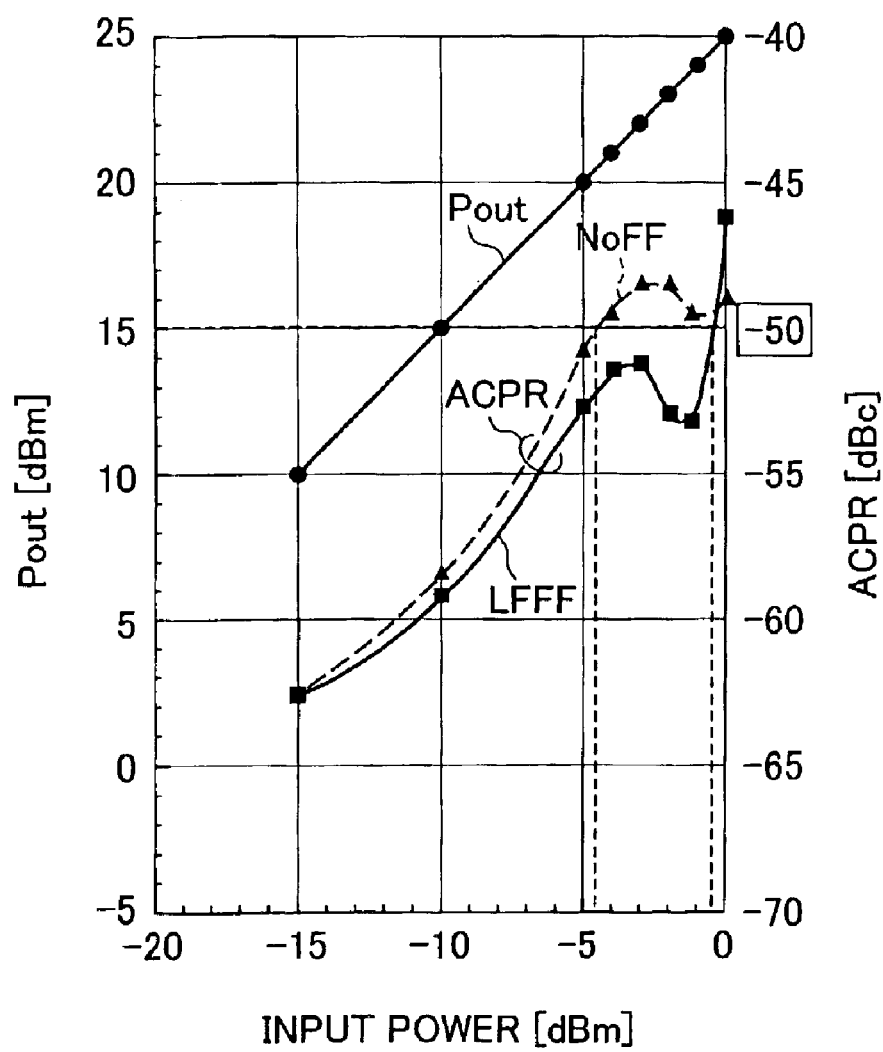
FIG. 3 is a characteristic graph which plots input power against output power and ACPR in a case where N-CDMA modulated signals are inputted to the power amplifying apparatus according to the first embodiment.

FIG. 3 is a characteristic graph which shows output power and ACPR (adjacent channel leakage power ratio) plotted against input power in a case where N-CDMA modulated wave signals are inputted to the power amplifying apparatus according to the present embodiment. The center frequency of the modulated waves is 900 MHz.

In FIG. 3, ACPR indicates the ratio between the power at a frequency that is offset from the radio frequency of the modulated waves by plus or minus 900 MHz and the power of the primary channel. LFFF (Low Filter Feed-Forward, shown with a solid line) indicates the characteristics when distortion compensation by the present invention is performed, and NoFF (shown with a broken line) shows the characteristics when distortion compensation by the present invention is not performed. As is apparent from the characteristics of LFFF, it is understood that the ACPR decreases at most input power levels by performing distortion compensation according to the present invention.

Figure 4:
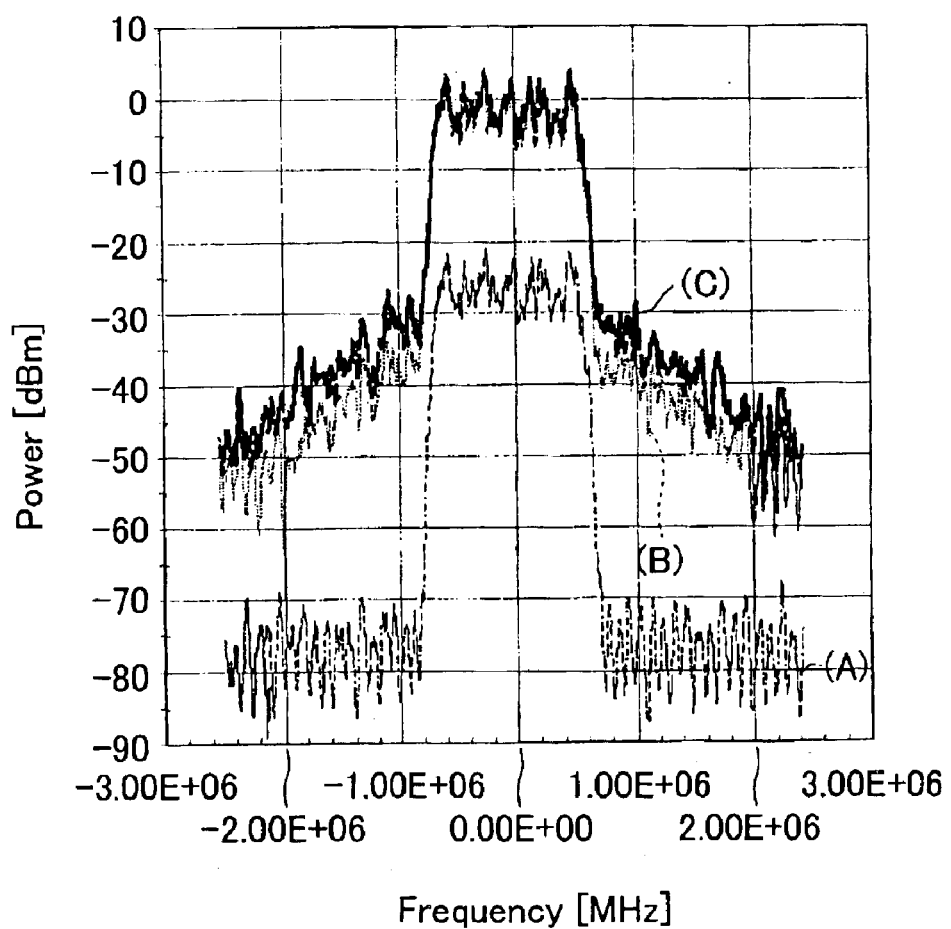
FIG. 4 is a frequency spectrum graph which shows the effects of performing distortion compensation according to the present invention.

FIG. 4 is a frequency spectrum chart which shows the effects obtained when distortion compensation by the present invention (LFFF) is performed. In FIG. 4, the broken line (A) indicates the spectrum of the input signals, the dotted line (B) indicates a spectrum outputted by an ordinary multistage power amplifier when no distortion compensation according to the present invention is performed (i.e. without LFFF), and the solid line (C) indicates a spectrum when distortion compensation according to the present invention is performed (i.e. with LFFF). At frequencies close to where an adjacent channel exists, the solid line (C) exceeds the dotted line (B), and this is the effect of the distortion compensation according to the present invention.

Figure 5:
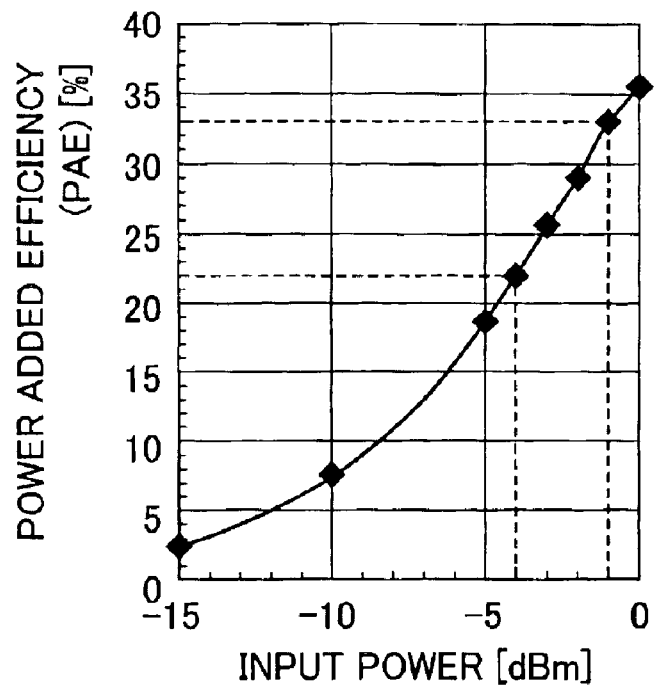
FIG. 5 is a characteristic graph which plots the power added efficiency of the power amplifying apparatus according to the present invention against the input power thereof.

FIG. 5 is characteristic graph in which the power added efficiency (PAE) of the power amplifying apparatus according to the present invention is plotted against input power. If, in FIG. 3, the characteristics of the ACPR given to the power amplifying apparatus were -50 dBc, only an input power of up to -4 dBm would be inputtable when the distortion compensation according to the present invention is not performed. As opposed thereto, by performing distortion compensation according to the present invention, this can be increased to -0.5 dBm as shown in FIG. 3. As a result, an increase of approximately 10% in the power added efficiency (PAE) is achieved as can be seen from FIG. 5.

Specific examples of configurations for the low-frequency amplifier 16 and the phase shifter 17 are described below.

Figure 6:
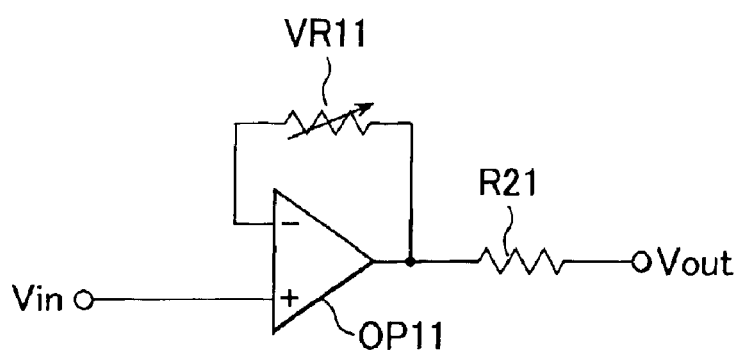
FIG. 6 is a circuit diagram which shows one example of a configuration of a low-frequency amplifier.

FIG. 6 is a circuit diagram which shows one example of a configuration for the low-frequency amplifier 16. The low-frequency amplifier 16 according to this example has a non-inverting amplifier configuration and includes an operational amplifier OP11 which takes input signal Vin as a non-inverting input, a variable resistor VR11 connected between the inverting (-) input terminal and output terminal of the operational amplifier OP11, and a resistance R21 that has one terminal connected to the output terminal of the operational amplifier OP11.

Figure 7:
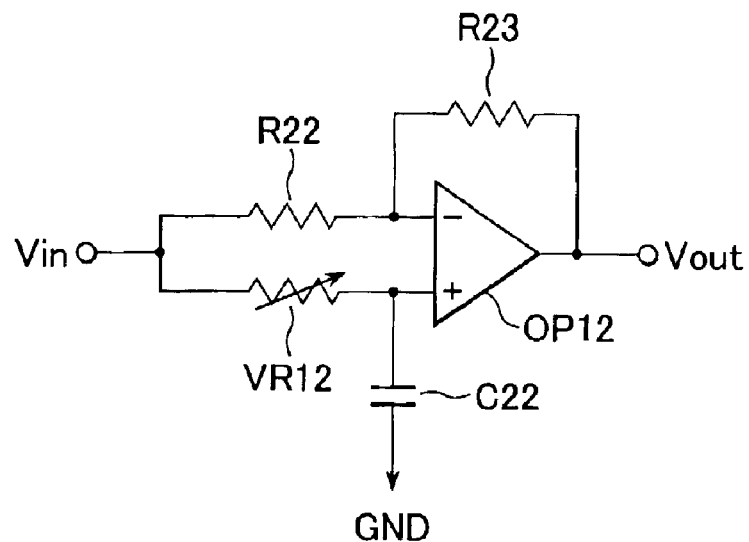
FIG. 7 is a circuit diagram which shows one example of a configuration of a phase shifter.

FIG. 7 is a circuit diagram which shows one example of a configuration of the phase shifter 17. The phase shifter 17 according to this example has a first-order all-pass filter configuration including an operational amplifier OP12, a variable resistor VR12, a resistor R22, a capacitor C22 and a resistor R23. One terminal of the variable resistor VR12 and one terminal of the resistor R22 are connected with each other to form an input terminal, and the other terminal of the variable resistor VR12 is connected to the inverting input terminal of the operational amplifier OP12 while the other terminal of the resistor R22 is connected to the non-inverting input terminal of the operational amplifier OP12. The capacitor C22 is connected between the non-inverting input terminal of the operational amplifier OP12 and ground. The resistor R23 is connected between the inverting input terminal and the output terminal of the operational amplifier OP12.

In the phase shifter 17 with the configuration described above, if the resistance of the variable resistor VR12 is R, and the capacitance of the capacitor C22 is C, the amount of phase shift $\Delta\theta$ at each angular frequency $\omega$ is expressed as $\Delta\theta = \tan^{-1}\{-2\omega CR/(1-\omega^2 C^2 R^2)\}$.

FIRST MODIFIED EXAMPLE OF THE FIRST EMBODIMENT

Figure 8:
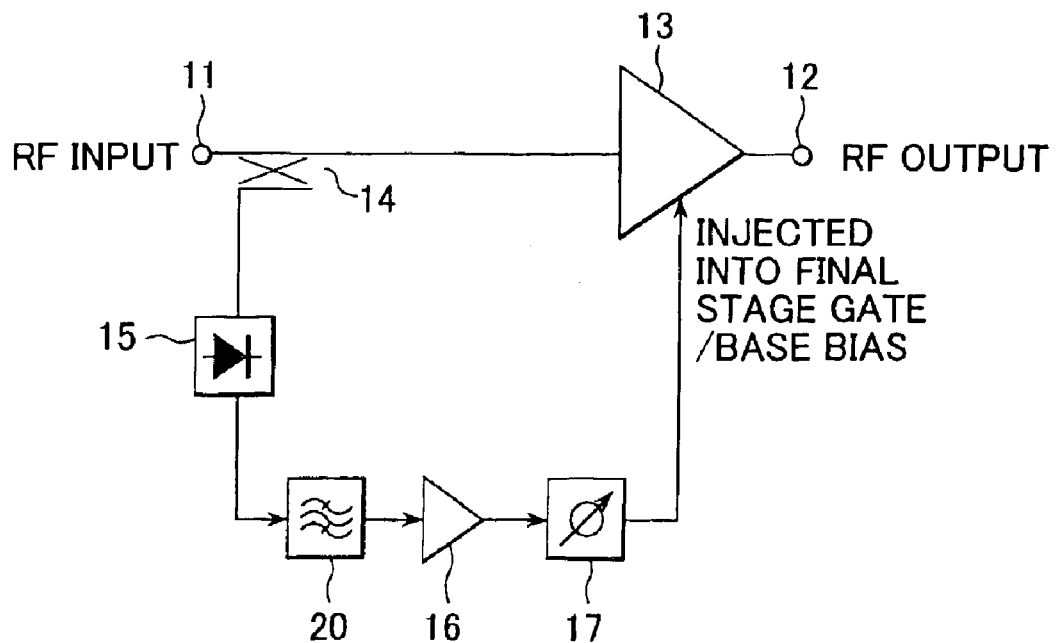
FIG. 8 is a block diagram which shows an example of a configuration of a power amplifying apparatus according to the first modified example of the first embodiment.

FIG. 8 is a block diagram showing an example of a configuration of a power amplifying apparatus according to the first modified example of the first embodiment, and like parts that can be found in FIG. 1 are identified with the same reference numerals and characters.

The power amplifying apparatus according to the present modified example adopts a configuration in which a band-pass filter (or a low-pass filter) 20 is provided between the detector 15 and the low-frequency amplifier 16. The basic operation of the power amplifying apparatus with such a configuration is similar to the operation described in connection with FIG. 1. However, in the power amplifying apparatus according to the present modified example, harmonic components contained in the low-frequency signals outputted from the detector 15 are actively filtered by the band-pass filter (or the low-pass filter) 20, and only low-frequency second-harmonic distortion components are extracted.

Thus, by providing the band-pass filter (or low-pass filter) 20 in a stage subsequent to the detector 15, thereby filtering out harmonic components contained in the low-frequency signals and extracting only the low-frequency second-harmonic distortion components, only the low-frequency second-harmonic distortion components are reinjected into the gate/base bias circuit of the final stage of the multistage RF amplifier 13. As a result, third-harmonic distortion cancellation effects are enhanced, and thus, distortion compensation effects are enhanced.

SECOND MODIFIED EXAMPLE OF THE FIRST EMBODIMENT

Figure 9:
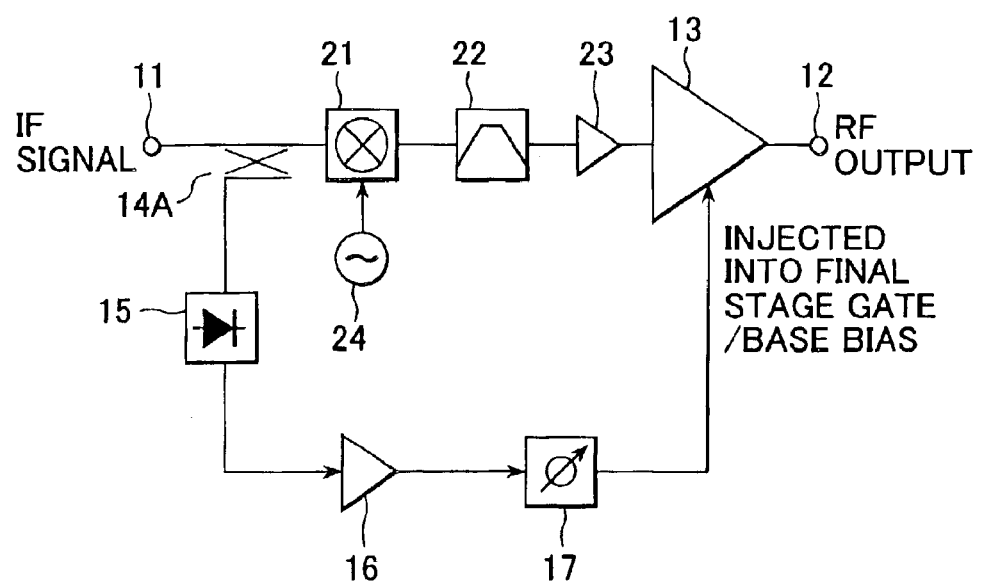
FIG. 9 is a block diagram which shows an example of a configuration of a power amplifying apparatus according to the second modified example of the first embodiment.

FIG. 9 is a block diagram showing an example of a configuration of a power amplifying apparatus according to the second modified example of the first embodiment, and like parts that can be found in FIG. 1 are identified with the same reference numerals and characters.

Whereas in the first embodiment and the first modified example, the detector 15 for detecting second-harmonic distortion components of low-frequency signals was provided in an RF stage, the present modified example adopts a configuration in which the detector 15 is provided in an IF stage (an intermediate frequency stage), and in which a portion of IF signals are inputted to the detector 15 via a coupler 14A.

In FIG. 9, a frequency converter 21, a band-pass filter (BPF) 22, a driver amplifier 23 and the multistage RF amplifier 13 are connected in cascade between the input terminal 11 and the output terminal 12. The frequency converter 21 converts IF signals into RF signals by mixing local oscillation signals provided from a local oscillator 24 with the IF signals.

The power amplifying apparatus according to the second modified example can be applied to a transmitter in which exists an IF stage as a transmission system. Because the delay time of low-frequency signals accrued from passing through the detector 15, the low-frequency amplifier 16, the phase shifter 17 and the like are cancelled out by the delay time of input signals accrued from passing through the frequency converter 21, the band-pass filter 22, the driver amplifier 23 and the like, deterioration in linear characteristics due to differences in delay time can be prevented.

In addition, in the first embodiment as well as the modified examples thereof, the phase shifter 17 is disposed in a stage subsequent to the low-frequency amplifier 16. However, in canceling out the originally present third-harmonic distortion with the newly generated third-harmonic distortion, it is not always necessary to perform phase adjustments of the low-frequency second-harmonic distortion components with the phase shifter 17. In such a case, similar effects can still be achieved even if the phase shifter 17 is omitted.

Also, the detector 15 detects an envelope curve (including second-harmonic distortion) of RF signals using the non-linearity of diodes and the like, however because diodes are analog devices, variations in characteristics due to the lack of uniformity during manufacture and due to temperature changes are inevitable. Linearization characteristics of the amplifier are compromised when the output potential of the detector 15 is influenced by such variables. A power amplifying apparatus according to the second embodiment of the present invention described below seeks to address such points.

<Second Embodiment>

Figure 10:
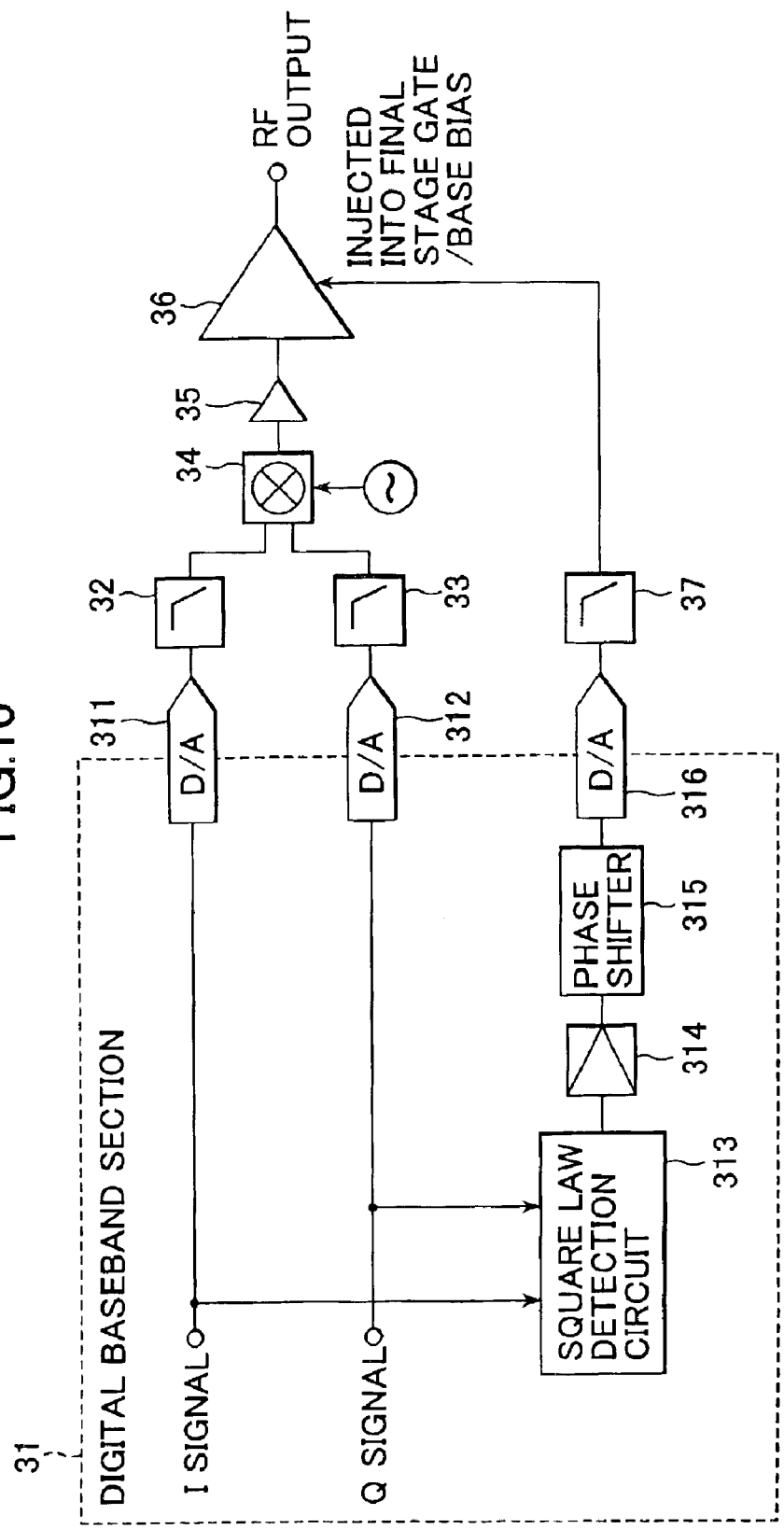
FIG. 10 is a block diagram which shows an example of a configuration of a power amplifying apparatus according to the second embodiment of the present invention.

FIG. 10 is a block diagram which shows an example of a configuration of a power amplifying apparatus according to the second embodiment of the present invention. The power amplifying apparatus according to the second embodiment adopts a configuration in which baseband signals are converted directly into RF signals without the use of intermediate frequencies in a transmission system such as radio terminals.

Referring to FIG. 10, a digital baseband section 31 converts I signals and Q signals into analog signals with D/A converters 311 and 312, respectively, and outputs them, while inputting them to an envelope curve computing means, for example a square law detection circuit 313, and computing an envelope curve. The computed envelope curve has its amplitude adjusted by a low-frequency amplifier 314, and its phase shifted by a phase shifter 315, after which it is converted into analog signals with a D/A converter 316, and is outputted as low-frequency analog signals.

The D/A converted I signals and Q signals outputted from the digital baseband section 31 are inputted to a quadrature modulator 34 via low-pass filters (LPFs) 32 and 33, and after being converted into RF signals by the quadrature modulator 34, are inputted to a multistage RF amplifier 36 via a driver amplifier 35.

On the other hand, low frequency analog signals outputted by the digital baseband section 31 are equivalent to the low-frequency second-harmonic distortion signals in the first embodiment, and are inputted between stages in the multistage RF amplifier 36, preferably to the gate/base bias circuit of the final-stage transistor, after passing through a low-pass filter 37. If the multistage RF amplifier 36 is, for example, FET based, the configuration of the bias circuit would be similar to the configuration of the final-stage bias circuit 134 in FIG. 2, for example.

Thus, by computing the envelope curve in the digital baseband section 31, because analog devices, such as diodes and the like, need not be used as detector circuits, degradation in characteristics due to device variations can be prevented. Similarly, because analog circuits need not be used as the low-frequency amplifier 314 and the phase shifter 315, degradation in characteristics caused by these devices can also be prevented.

In addition, as in the first modified example of the first embodiment, harmonic components contained in low-frequency signals can be actively filtered out and low-frequency second-harmonic distortion components can be extracted by providing a digital BPF or LPF in a stage subsequent to the square law detection circuit 313 provided as envelope computing means. Thus, because only the low-frequency second-harmonic distortion components are reinjected into the gate/base bias circuit of the final stage of the multistage RF amplifier 36, distortion compensation effects can be enhanced.

However, it is to be noted that in the power amplifying apparatus of the first embodiment, whereas RF signals are inputted to the multistage RF amplifier intact, low-frequency signals generated in the detector 15 pass through the low-frequency amplifier 16 and the phase shifter 17, and in addition the BPF (or LPF) 20 in the case of the first modified example, and thus, delay time becomes longer. So long as the delay time is insignificant in relation to the chip rate of the signal modulated wave, it is not a problem, however, once it rises to a level of significance, it degrades the linearizing characteristics of the power amplifying apparatus. A power amplifying apparatus according to the third embodiment described below seeks to address such points.

<Third Embodiment>

Figure 11:
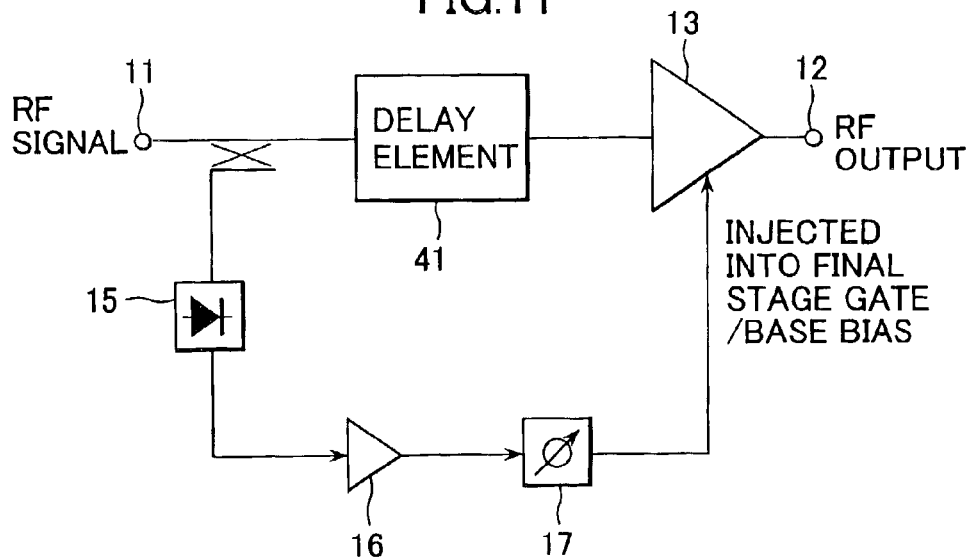
FIG. 11 is a block diagram which shows an example of a configuration of a power amplifying apparatus according to the third embodiment of the present invention.

FIG. 11 is a block diagram showing an example of a configuration of a power amplifying apparatus according to the third embodiment of the present invention, and like parts that can be found in FIG. 1 are identified with the same reference numerals and characters.

In the power amplifying apparatus according to the present embodiment, a configuration in which a delay element 41, such as a SAW (Surface Acoustic Wave) filter, is provided between the input terminal 11 and the multistage RF amplifier 13. As a result, RF signals pass through the delay element 41 before being inputted to the multistage RF amplifier 13.

Thus, by providing the delay element 31 between the input terminal 11 and the multistage RF amplifier 13, the difference between the delay time of the low-frequency signals passing through the low-frequency amplifier 16 and the phase shifter 17, as well as the BPF (or LPF) 20 in some cases, and the delay time of the RF signals passing through the delay element 31 becomes smaller, thereby preventing degradation in the linearizing characteristics stemming from differences in delay time. In other words, it becomes possible to apply the linearizing method of the present invention even to modulated signals of a high chip rate.

APPLICATION EXAMPLE

Figure 12:
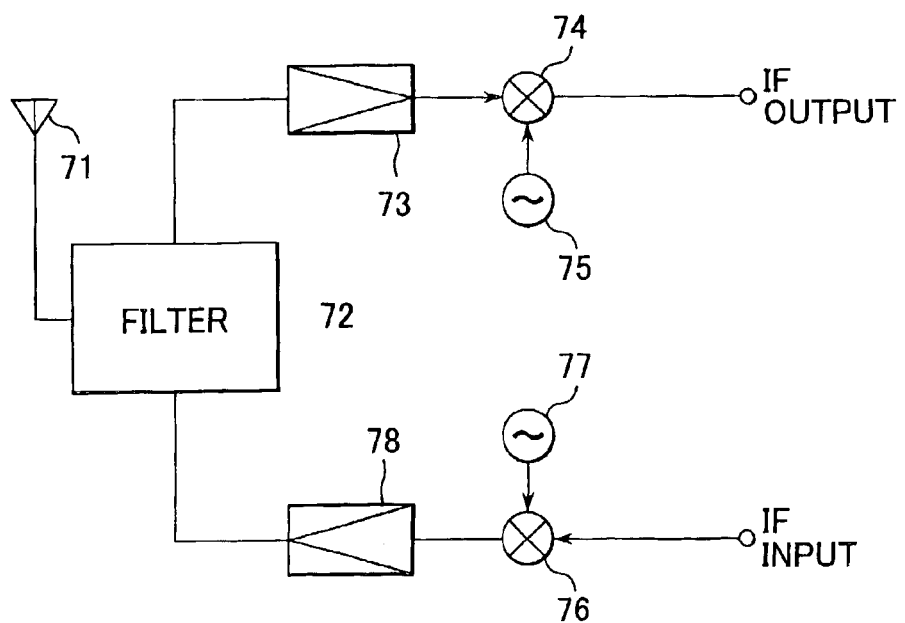
FIG. 12 is a block diagram which shows one example of a configuration of an RF front-end section in a CDMA system cellular phone.

The power amplifying apparatus according to any one of the first through third embodiments explained above is used to configure a power amplifier in an RF front-end section of a radio communications apparatus, such as a CDMA system cellular phone. FIG. 12 is a block diagram which shows one example of a configuration of an RF front-end section in a CDMA system cellular phone.

Referring to FIG. 12, signals received by the antenna 71 pass through a filter 72, and are inputted to a mixer 74 after the signal level is made constant through an AGC amplifier 73. After being converted to an intermediate frequency (IF) in the mixer 74 by being mixed with a local oscillation frequency from a local oscillator 75, the signals are supplied to a baseband IC (not shown) of one of the subsequent stages.

On the other hand, on the transmission side, IF signals supplied from the baseband IC of a preceding stage are inputted to a mixer 76, and are converted into RF signals by being mixed with a local oscillation frequency from a local oscillator 77. The RF signals are supplied to the antenna 71 via the filter 72 after being amplified with the RF power amplifier 78, and are transmitted from the antenna 71 as radio waves.

In the RF front-end section of a CDMA system cellular phone with the configuration described above, a power amplifying apparatus according to any one of the first through third embodiments described above is used as the RF power amplifier 78 on the transmission side.

Thus, in the RF front-end section in a radio communications apparatus, by using a power amplifying apparatus according to any one of the first through third embodiments described above as the RF power amplifier 78 on the transmission side, down-sizing of the apparatus and a reduction in cost can be achieved since the power amplifying apparatuses according to the first through the third embodiments do not require a large inductance element. These benefits are particularly significant when the power amplifying apparatuses described above are applied to mobile radio communications apparatuses such as cellular phones.

In addition, in the application example explained above, a case where a power amplifying apparatus according to one of the embodiments mentioned above is applied to a CDMA system cellular system is described, however, the present invention is not limited as such and can be widely applied to radio communications apparatuses in general.

Since the invention disclosed herein may be embodied in other specific forms without departing from the spirit or general characteristics thereof, some of which forms have been indicated, the embodiments and examples described herein are to be considered in all respects illustrative and not restrictive. The scope of the invention is to be indicated by the appended claims, rather than by the foregoing description, and all changes which come within the meaning and range of equivalents of the claims are intended to be embraced therein.

What is claimed is:

1. A power amplifying apparatus, comprising:
   RF amplifying means including a plurality of transistor stages;
   envelope curve computing means for computing a digital envelope signal from two chrominance signals in a digital baseband section;
   a D/A converter for converting a digital envelope signal outputted from said envelope curve computing means into an analog signal; and
   means for injecting an analog envelope signal outputted by said D/A converter into one of a gate and base bias of a final stage of said RF amplifying means.

2. The power amplifying apparatus according to claim 1, wherein said digital baseband section includes a low-frequency amplifier for amplifying a digital envelope signal outputted by said envelope curve computing means.

3. The power amplifying apparatus according to claim 1, wherein said digital baseband section includes a phase shifter for adjusting a phase of a digital envelope signal outputted by said envelope curve computing means.

4. The power amplifying apparatus according to claim 1, wherein said digital baseband section includes an envelope curve computing means whose output is inputted to a filter for blocking a harmonic component included in a digital envelope signal outputted by said envelope curve computing means.

5. A radio communications apparatus with a power amplifying apparatus as a power amplifier configuring a front-end of a transmission system, said power amplifying apparatus comprising:
   RF amplifying means including a plurality of transistor stages;
   envelope curve computing means for computing a digital envelope signal from two chrominance signals in a digital baseband section;
   a D/A converter for converting a digital envelope signal outputted by said envelope curve computing means into an analog signal; and
   a bias circuit for injecting an analog envelope signal outputted by said D/A converter into one of a gate and base bias of a final stage in said RF amplifying means.

* * * * *